(12) United States Patent (10) Patent No.: US 11,521,972 B2
Gardner et al. (45) Date of Patent: Dec. 6, 2022

(54) HIGH PERFORMANCE MULTI-DIMENSIONAL DEVICE AND LOGIC INTEGRATION

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 8 days.

(21) Appl. No.: 17/097,146

(22) Filed: Nov. 13, 2020

(65) Prior Publication Data

US 2021/0343714 A1 Nov. 4, 2021

Related U.S. Application Data

(60) Provisional application No. 63/018,947, filed on May 1, 2020.

(51) Int. Cl.
*H01L 27/092* (2006.01)
*H01L 29/06* (2006.01)
(Continued)

(52) U.S. Cl.
CPC .... *H01L 27/0922* (2013.01); *H01L 21/02532* (2013.01); *H01L 21/02603* (2013.01);
(Continued)

(58) Field of Classification Search
CPC .......... H01L 27/0922; H01L 21/02532; H01L 21/02603; H01L 21/02675;
(Continued)

(56) References Cited

U.S. PATENT DOCUMENTS 5,712,191 A 1/1998 Nakajima et al.
5,937,282 A 8/1999 Nakajima et al.
(Continued)

FOREIGN PATENT DOCUMENTS

KR 10-0647364 B1 11/2006

OTHER PUBLICATIONS

International Search Report dated Jul. 20, 2021 in PCT/US2023/025082, 9 pages.

*Primary Examiner* — Tong-Ho Kim
(74) *Attorney, Agent, or Firm* — Oblon, McClelland, Maier & Neustadt, L.L.P.

(57) ABSTRACT

A semiconductor device is provided. The semiconductor device can include a bottom substrate, a device plane over the bottom substrate, a dielectric layer over the device plane, localized substrates over the dielectric layer, and semiconductor devices over the localized substrates. The localized substrates can be separated from each other along a top surface of the bottom substrate. A method of microfabrication is provided. The method can include forming a target layer over a bottom substrate where the target layer includes one or more localized regions that include one or more semiconductor materials. The method can also include performing a thermal process to change crystal structures of the one or more localized regions of the target layer. The method can further include forming semiconductor devices over the localized regions of the target layer.

16 Claims, 12 Drawing Sheets

(51) Int. Cl.
- *H01L 29/423* (2006.01)
- *H01L 29/786* (2006.01)
- *H01L 21/02* (2006.01)
- *H01L 21/8238* (2006.01)
- *H01L 29/66* (2006.01)

(52) U.S. Cl.
CPC ............ *H01L 21/02675* (2013.01); *H01L 21/823807* (2013.01); *H01L 29/0673* (2013.01); *H01L 29/42392* (2013.01); *H01L 29/66742* (2013.01); *H01L 29/78696* (2013.01)

(58) Field of Classification Search
CPC ......... H01L 21/823807; H01L 29/0673; H01L 29/42392; H01L 29/66742; H01L 29/78696; H01L 27/092; H01L 27/108
USPC .......................................................... 257/351
See application file for complete search history.

(56) References Cited

U.S. PATENT DOCUMENTS

| | | |
|---|---|---|
| 6,242,289 B1 | 6/2001 | Nakajima et al. |
| 6,479,329 B2 | 11/2002 | Nakajima et al. |
| 7,229,861 B2 | 6/2007 | Nakajima et al. |
| 7,879,689 B2 | 2/2011 | Moriwaka |
| 8,293,627 B2 | 10/2012 | Lieten |
| 8,344,385 B2 | 1/2013 | Kim et al. |
| 8,653,568 B2 | 2/2014 | Moriwaka |
| 2002/0025612 A1 | 2/2002 | Nakajima et al. |
| 2003/0129853 A1* | 7/2003 | Nakajima ........... H01L 21/2026 438/795 |
| 2009/0127591 A1 | 5/2009 | Moriwaka |
| 2010/0159676 A1 | 6/2010 | Lieten |
| 2011/0073866 A1* | 3/2011 | Kim .................. H01L 27/11582 257/326 |
| 2011/0114998 A1 | 5/2011 | Moriwaka |

* cited by examiner

HIGH PERFORMANCE MULTI-DIMENSIONAL DEVICE AND LOGIC INTEGRATION

INCORPORATION BY REFERENCE

This present disclosure claims the benefit of U.S. Provisional Application No. 63/018,947, filed on May 1, 2020, the entire content of which is incorporated herein by reference in its entirety.

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a bottom substrate. Historically, with microfabrication, transistors have been created in one plane, with wiring/metallization formed above the active device plane, and have thus been characterized as two-dimensional (3D) circuits or 3D fabrication. Scaling efforts have greatly increased the number of transistors per unit area in 3D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a semiconductor device and methods of microfabrication.

A first aspect is a semiconductor device. The semiconductor device can include a bottom substrate and a device plane over the bottom substrate. The device plane includes at least a first layer of semiconductor devices. The semiconductor device can also include a first dielectric layer over the device plane and localized substrates over the first dielectric layer. The localized substrates are separated from each other along a top surface of the bottom substrate. The semiconductor device can further include a second layer of semiconductor devices over the localized substrates.

In some embodiments, the first dielectric layer includes a recess filled by a corresponding localized substrate. In some embodiments, the localized substrates are crystalline. In some embodiments, the localized substrates include at least one of silicon or germanium. In some embodiments, the second layer of semiconductor devices includes an n-type metal-oxide-semiconductor (NMOS) over a localized silicon substrate and a p-type metal-oxide-semiconductor (PMOS) over a localized germanium substrate.

A second aspect is a method of microfabrication. A target layer is formed over a bottom substrate. The target layer includes one or more localized regions that include one or more semiconductor materials. A thermal process is performed to change crystal structures of the one or more localized regions of the target layer, and semiconductor devices are formed over the localized regions of the target layer.

In some embodiments, the thermal process includes metal crystal annealing. Prior to performing the thermal process, a patterned seed layer can be formed on the target layer. The patterned seed layer includes localized seed regions on the localized regions of the target layer. The localized seed regions can have at least one geometric shape that directs crystallization of the localized regions of the target layer to a predetermined crystal orientation during the metal crystal annealing.

In some embodiments, the thermal process includes laser annealing. Prior to forming the target layer, a cap layer can be formed over the bottom substrate, and recesses can be formed in the cap layer so that the target layer fills the recesses.

In some embodiments, the thermal process makes the localized regions of the target layer crystalline, and the crystalline localized regions of the target layer can function as localized substrates for the semiconductor devices.

In some embodiments, prior to forming the target layer, a device plane is formed over the bottom substrate. The device plane includes at least one layer of semiconductor devices. One or more dielectric layers can be over the device plane, and the one or more dielectric layers include a first dielectric layer. In some embodiments, recesses can be formed in the first dielectric layer so that the target layer fills the recesses. In some embodiments, a portion of the target layer over the first dielectric layer may be removed so that the remaining portion of the target layer is in the recesses.

In some embodiments, prior to performing the thermal process, the localized regions of the target layer are doped.

A third aspect is a method of microfabrication. A stack of alternating insulating layers and sacrificial word line layers is formed over a bottom substrate. Channel openings are formed in the stack. Sidewall structures are formed on sidewalls of the channel opening. The sidewall structures include channel layers. A thermal process is performed to change crystal structures of the channel layers.

In some embodiments, prior to forming the stack, a device plane is formed over the bottom substrate. The device plane includes at least one layer of semiconductor devices. One or more dielectric layers are formed over the device plane, and the one or more dielectric layers are sandwiched between the device plane and the stack.

In some embodiments, prior to performing the thermal process, localized seed regions are formed on the channel layers. The localized seed regions can direct crystallization of the channel layers during the thermal process, wherein the thermal process includes metal crystal annealing.

In some embodiments, the sacrificial word line layers are replaced with word line layers.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the conventional practice in the industry, various features are not drawn to scale. In fact, the dimensions of the various features may be increased or reduced for clarity of discussion.

DETAILED DESCRIPTION

Figure 1A:
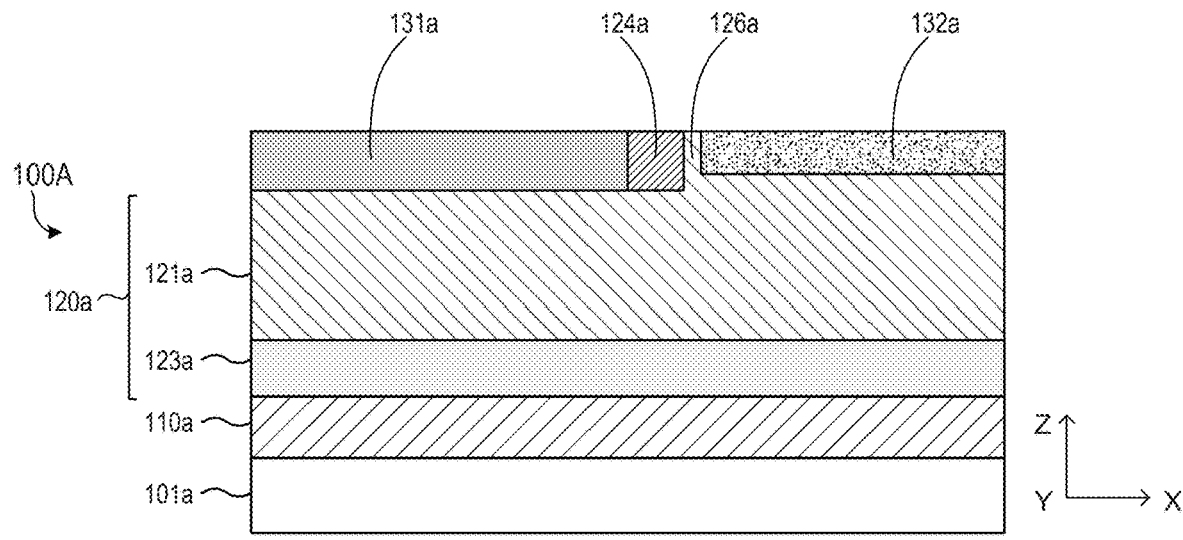
FIGS. 1A, 1B, and 1C show cross-sectional views of semiconductor devices, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

As noted in Background, 3D integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

Techniques herein include methods of microfabrication of 3D devices that include depositing amorphous germanium or polycrystalline germanium and converting the deposited germanium into crystalline germanium, which can be single-crystal germanium or crystalline germanium with relatively large grain boundaries. This converted germanium can be used for 3D memory or 3D logic. These techniques enable higher density circuits to be produced at reduced cost. 3D memory cells can benefit with high-mobility properties of Ge.

Techniques here enable high-performance Ge channel and Si channel 3D-GAA (gate-all-around) devices. Re-crystallization of high performance Ge is achieved by using metal crystal at low temperatures. Techniques here enable 3D transistor stacking to be increased using the same wafer. In one embodiment, a laser annealing is used to convert both amorphous poly silicon and amorphous poly Ge into single-crystal Ge and single-crystal Si for optimum CMOS performance. Other benefits include reduction in circuit area because transistors are stacked on multiple levels. Techniques include a new transistor type with a Ge vertical channel. High mobility Ge devices herein enable higher performance with increased Idsat (drive current).

There are several example embodiments disclosed herein. One embodiment includes a metal crystal annealing of amorphous silicon adjacent to amorphous germanium to make crystalline Si and crystalline Ge. Another embodiment includes a laser annealing of amorphous silicon adjacent to amorphous germanium to make crystalline Si and crystalline Ge. Another embodiment is Ge crystal enhancement using a Ge channel structure using re-crystallization (can be cylindrical or rectangular) in a localized region. Another embodiment include Ge crystal enhancement using a cylindrical Ge shell vertical channel structure using re-crystallization in a localized region.

FIG. 1A shows a cross-sectional view of a semiconductor device 100A, in accordance with some embodiments. The device 100A includes a bottom substrate 101a and a device plane 110a over the bottom substrate 101a. The device plane 110a can have at least a first layer of semiconductor devices, such as planar and/or 3D devices such as FinFET, lateral gate-all-around, NAND memory, et cetera. The device 100A can also include one or more dielectric layers 120a, such as a first dielectric layer 121a and a second dielectric layer 123a, over the device plane 110a. The one or more dielectric layers 120a can isolate the device plane 110a and may also protect the device plane 110a from temperature spikes in some embodiments.

Further, the device 100A can include localized substrates, such as a first localized substrate 131a and a second localized substrate 132a, over the dielectric layers 120a. The device 100A can typically include more than two localized substrates in other embodiments. The localized substrates can be polycrystalline or monocrystalline. Note that with polycrystalline structures, the grain boundaries are relatively large and can be as large as a respective localized substrate.

This means that the respective localized substrate is effectively single-crystal. The localized substrates can include one or more semiconductor materials. The semiconductor materials can be undoped or doped with various dopants of various concentrations. In this example, the first localized substrate 131a and the second localized substrate 132a are made of undoped silicon and undoped germanium, respectively. In another example, the silicon may be doped with boron, and the germanium may be doped with phosphorus or arsenic. In some embodiments, the first localized substrate 131a and the second localized substrate 132a can be made of a same semiconductor material, such as silicon or germanium.

Still referring to FIG. 1A, the localized substrates are separated from each other along a top surface of the bottom substrate 101a. As shown, the first localized substrate 131a and the second localized substrate 132a are separated by a dielectric region 124a and a vertical portion of a dielectric film 126a. While not shown, the device 100A can include a second layer of semiconductor devices over the localized substrates. In this example, the second layer of semiconductor devices can include an n-type metal-oxide-semiconductor (NMOS) over a localized silicon substrate and a p-type metal-oxide-germanium (PMOS) over a localized germanium substrate. In another example, an NMOS device may be disposed on a localized silicon substrate, and a PMOS device may be disposed on another localized silicon substrate. In another example, an NMOS device may be disposed on a localized germanium substrate, and a PMOS device may be disposed on another localized germanium substrate.

Figure 1B:
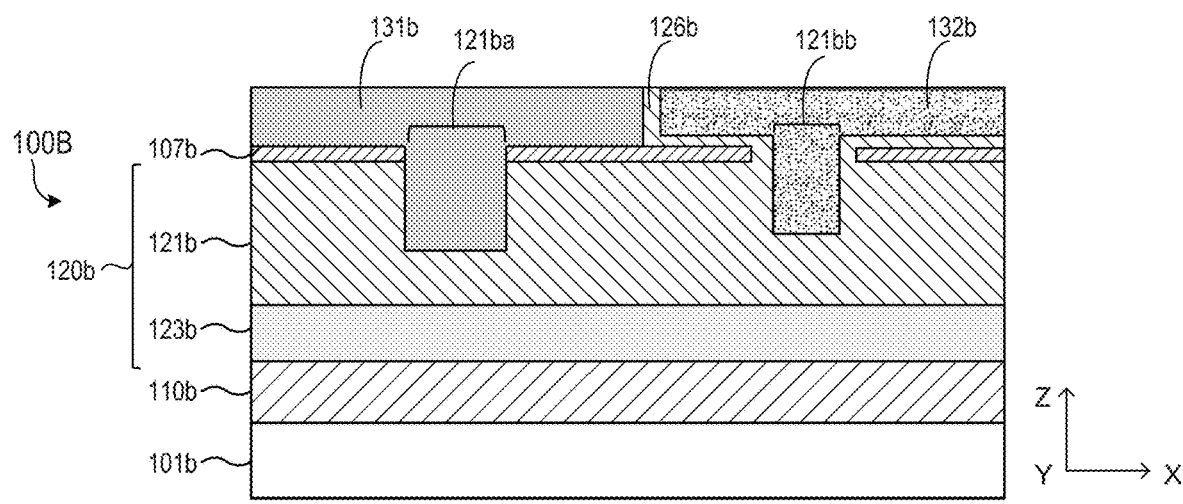

FIG. 1B shows a cross-sectional view of a semiconductor device 100B, in accordance with some embodiments. The device 100B can have a bottom substrate 101b, a device plane 110b, and one or more dielectric layers 120b (e.g., a first dielectric layer 121b and a second dielectric layer 123b) that correspond to the bottom substrate 101a, the device plane 110a, and the one or more dielectric layers 120a in the device 100A, respectively. A first localized substrate 131b, a second localized substrate 132b, and a vertical portion of a dielectric film 126b are similar to the first localized substrate 131a, the second localized substrate 132a, and the vertical portion of the dielectric film 126a, respectively. The descriptions have been provided above and will be omitted here for simplicity purposes.

As demonstrated in FIG. 1B, the first dielectric layer 121b can have recesses that are filled by respective localized substrates. In this example, a first recess 121ba and a second recess 121bb can be filled by the first localized substrate 131b and the second localized substrate 132b, respectively. Additionally, the device 100B may include a cap layer 107b between the dielectric layers 120b and the localized substrates 131b and 132b. In some embodiments, the cap layer 107b can assist in annealing during manufacturing, for example by absorbing film stress during recrystallization.

Figure 1C:
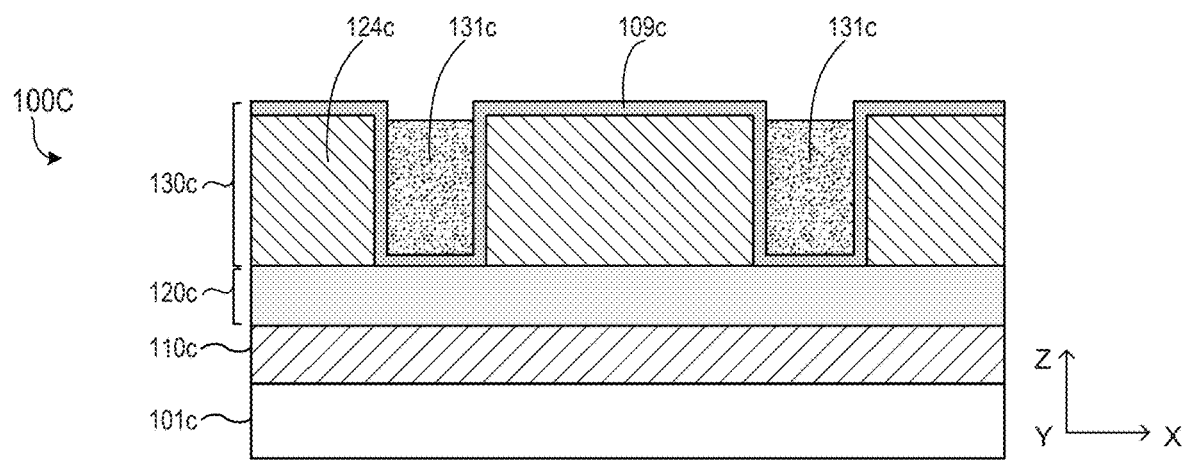

FIG. 1C shows a cross-sectional view of a semiconductor device 100C, in accordance with some embodiments. Since the example embodiment of the device 100C is similar to the example embodiment of the device 100A in FIG. 1A, explanation will be given with emphasis placed upon differences. While the dielectric layer(s) 120c is illustrated as a single layer, the dielectric layer(s) 120c can include two or more dielectric layers. The device 100C can have localized substrates 131c that are separated from each other by dielectric regions 124c. A dielectric film 109c may be disposed conformally over the dielectric regions 124c and the dielectric layer(s) 120c. In some embodiments, the dielectric regions 124c and the dielectric layer(s) 120c can function as the first dielectric layer and the second dielectric layer, respectively (e.g., in FIGS. 5A-5F).

Figure 2:
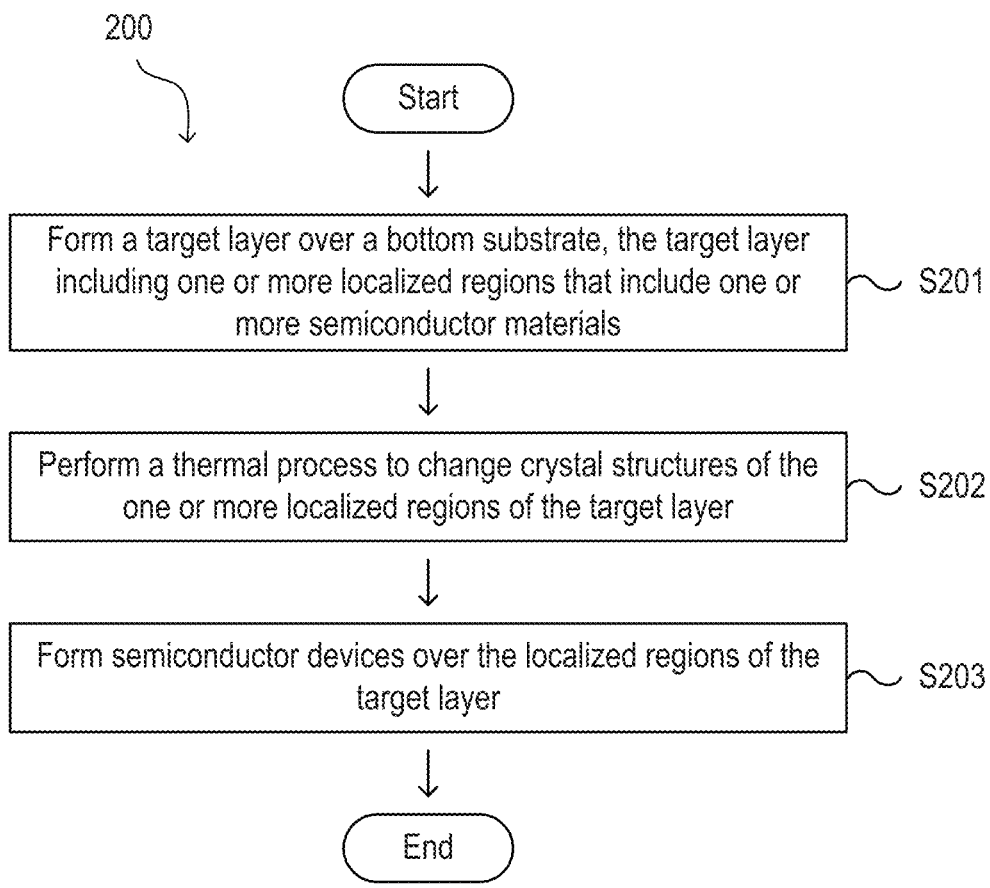
FIG. 2 shows a flow chart of an exemplary process of microfabrication, in accordance with embodiments of the disclosure.

FIG. 2 shows a flow chart of an exemplary process 200 of microfabrication, in accordance with embodiments of the disclosure. The process 200 begins with step S201 where a target layer is formed over a bottom substrate. The target layer can include one or more localized regions that are filled with doped or undoped semiconductor materials. For example, the localized regions can be filled with at least one of amorphous Si or amorphous Ge and separated from each other by a dielectric. In some embodiments, a device plane is formed over the bottom substrate, and the device plane includes at least one layer of semiconductor devices. One or more dielectric layers are then formed over the device plane. The one or more dielectric layers include a first dielectric layer, and the target layer is disposed over the first dielectric layer.

At step S202, a thermal process is performed to change crystal structures of the one or more localized regions of the target layer. For example, the thermal process can make the localized regions of the target layer crystalline. In one embodiment, the thermal process includes metal crystal annealing. Accordingly, a patterned seed layer can be formed on the target layer. The patterned seed layer includes localized seed regions on the localized regions of the target layer. The localized seed regions can have at least one geometric shape that directs crystallization of the localized regions of the target layer to a predetermined crystal orientation during the metal crystal annealing. In another embodiment, the thermal process includes laser annealing.

The process 200 then proceeds to step S203 where semiconductor devices are formed over the localized regions of the target layer. In some embodiments, the localized regions of the target layer can function as localized substrates. For example, a PMOS device can be formed on a localized crystalline Ge substrate while an NMOS device can be formed on localized crystalline Si substrate.

FIGS. 3A-3G are cross-sectional views of a semiconductor device 300 that can eventually become the device 100A in FIG. 1A, at various intermediate steps of microfabrication, in accordance with exemplary embodiments of the disclosure. Particularly, FIGS. 3A-3G can show a process for metal crystal annealing of amorphous silicon next to amorphous germanium. Note that crystalline germanium or silicon can include both polycrystalline structure as well as monocrystalline forms. Note that with polycrystalline germanium or silicon, the grain boundaries are relatively large and can be as large as a region within which the germanium or silicon is contained such that the grain boundaries are as large as the respective region. This means that the crystalline germanium or silicon is effectively single-crystal germanium or silicon within its respective region. Note also that examples herein show amorphous silicon (for NMOS example) and amorphous germanium (PMOS) being converted to single-crystal silicon and single-crystal Ge respectively. Other embodiments can have just one channel type (i.e., Si only or Ge only for an entire layer). In some embodiments, other semiconductor materials may be used.

Figure 3A:
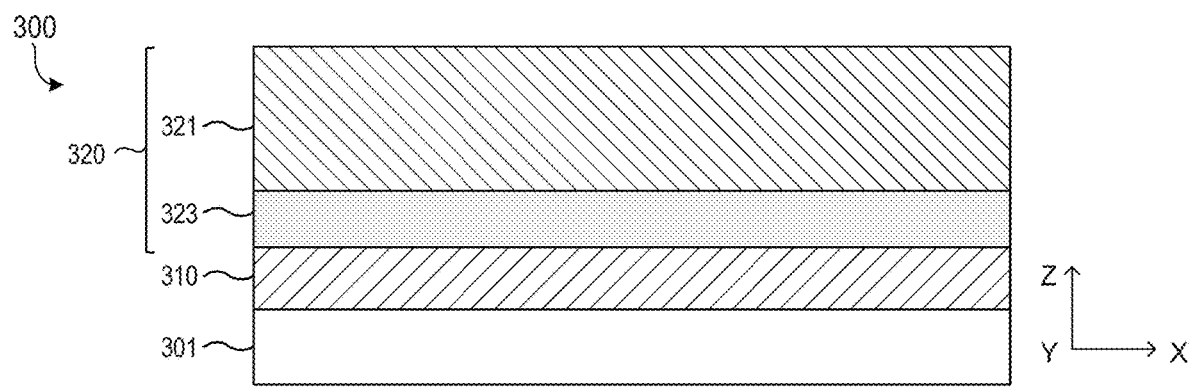
FIGS. 3A, 3B, 3C, 3D, 3E, 3F, and 3G are cross-sectional views of a semiconductor device at various intermediate steps of microfabrication, in accordance with exemplary embodiments of the disclosure.

As shown in FIG. 3A, a device plane 310 can be formed over a bottom substrate 301. This existing device region 310 can have planar and/or 3D devices such as FinFET, lateral gate-all-around, NAND memory, et cetera. One or more dielectric layers 320 (e.g., a first dielectric layer 321 and a second dielectric layer 323) can be formed over the device plane 310.

Figure 3B:
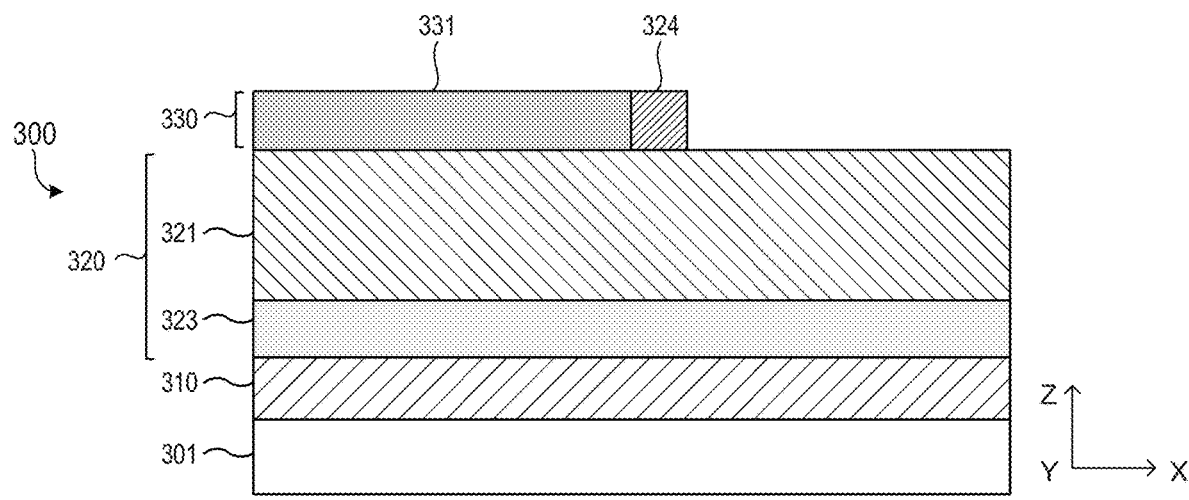

In FIG. 3B, a portion of a target layer 330 is formed over the first dielectric layer 321. The portion of the target layer 330 includes a first localized region 331 (also referred to as a first region) and a dielectric region 324. The first region 331 can include a first semiconductor material, such as amorphous silicon or germanium. In this example, the first region 331 is filled with amorphous silicon, and future NMOS can be formed thereon. The dielectric region 324 can function as an isolation structure and, for example, be silicon oxide. In order to form the portion of the target layer 330, a first semiconductor layer (not shown) is deposited over the dielectric layers 320. A photoresist etch mask (not shown) is then formed on the first semiconductor layer to demarcate the first region 331. Subsequently, a directional etch is executed, such as a plasma-based etch to remove uncovered portions of the first semiconductor layer so that the first region 331 is formed. The etch mask can then be removed. Next, a dielectric (not shown) can be deposited, such as silicon oxide. This deposition can have an overburden which can be removed using a polish such as chemical mechanical planarization (CMP). This can leave the oxide deposition planar with the first region 331. The first region 331 and a portion of the oxide at the edge of the first region 331 are masked and then the uncovered oxide is removed. Consequently, the dielectric region 324 is formed. This dielectric region 324 defines isolation between future NMOS and PMOS regions.

Figure 3C:
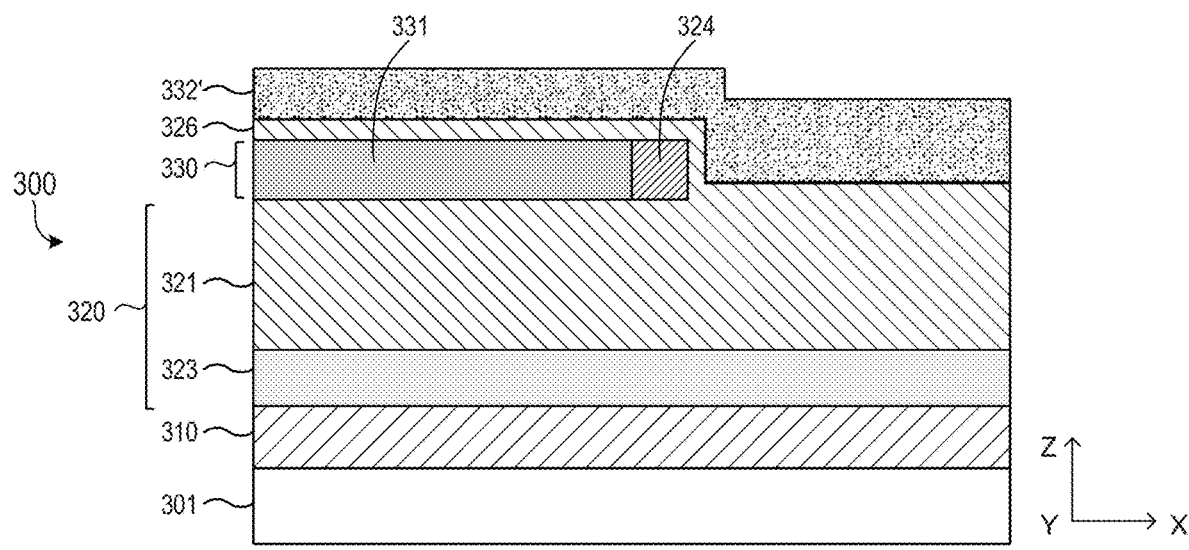

In FIG. 3C, a dielectric film 326 can be deposited on the first region 331, the dielectric region 324, and the first dielectric layer 321. Then a second semiconductor layer 332' is deposited over the dielectric film 326. In this example, the second semiconductor layer 332' is made of amorphous germanium, and the dielectric film 326 is made of a same material as the first dielectric layer 321, such as $SiO_2$, $Si_xOy$, $SiO_xN_y$, a high-k dielectric, a high-k oxynidride (e.g., $HfO_xNy$, $ZrO_xN_y$), or another suitable dielectric. Alternatively, the first region 331 and the second semiconductor layer 332' may be made of amorphous germanium and amorphous silicon, respectively. Note that in other embodiments, amorphous germanium or silicon can be used for both future NMOS and PMOS regions. In some embodiments, other semiconductor materials may be used for the first region 331 and the second semiconductor layer 332'.

Figure 3D:
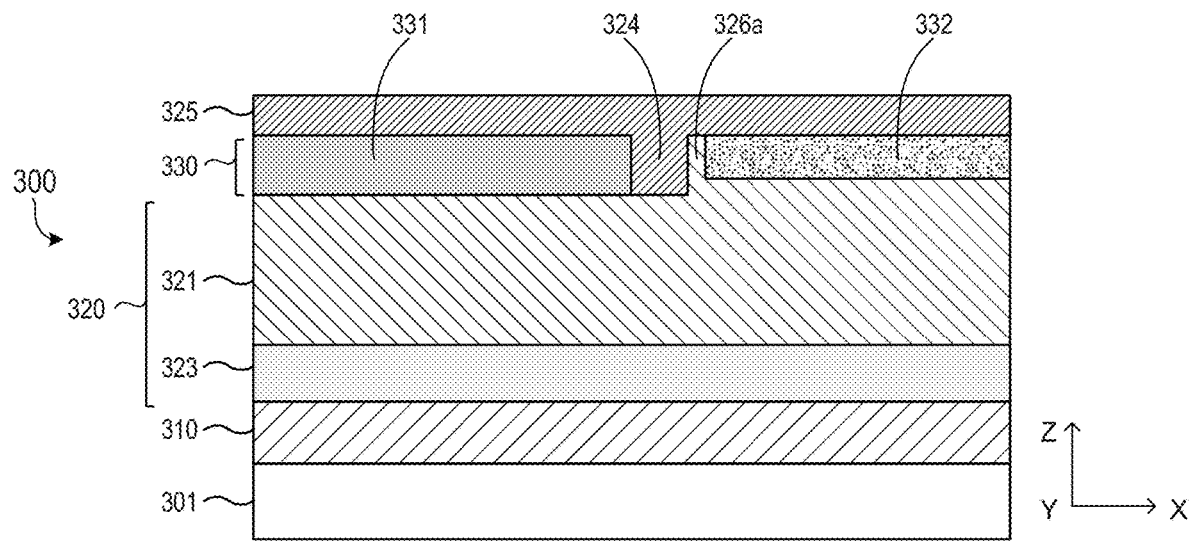

In FIG. 3D, the overburden of the second semiconductor layer 332' and the upper horizontal part of the dielectric film 326 are removed by CMP and cleaned to form a second localized region 332 (also referred to as a second region). A third dielectric layer 325 that is made of a same material as the dielectric region 324 can be deposited thereon. As a result, the target layer 330 is completed. The dielectric region 324 and the vertical portion of the dielectric film 326a can not only provide electrical isolation, but also function as a diffusion barrier during future annealing. Additionally, in some embodiments, the device 300 can typically have more than two localized regions (e.g., 331 and 332). In some embodiments, the third dielectric layer 325 can be made of a different material from the dielectric region 324.

Figure 3E:
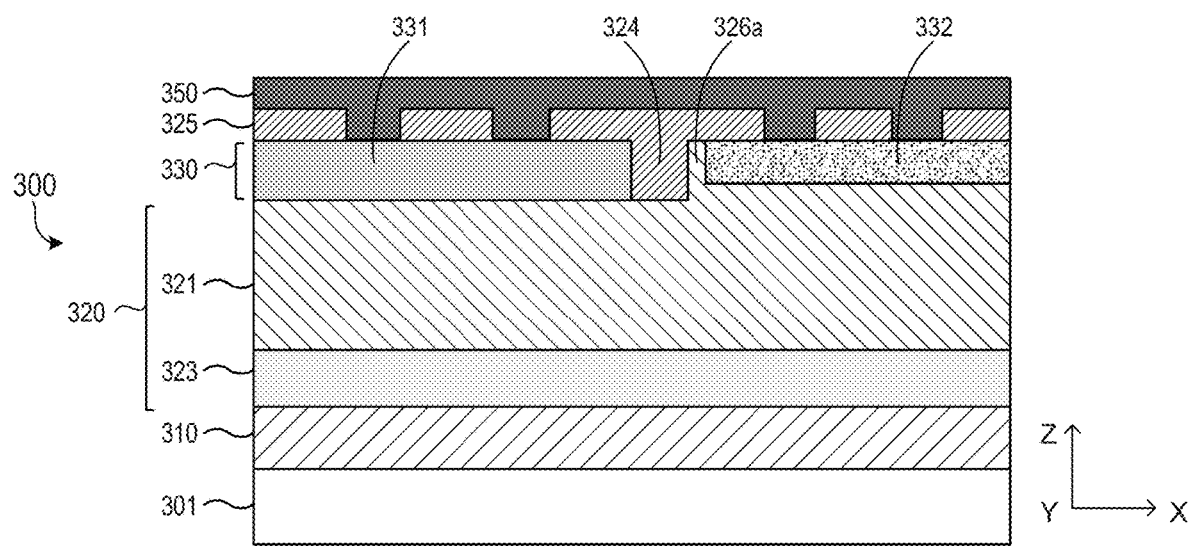

In FIG. 3E, a patterned metal layer 350 is formed. First, an etch mask (not shown) is formed over the device 300. This etch mask defines openings in the third dielectric layer 325 for metal seed regions. Example metals to be deposited include Ni, Ti, Cu, Co, Mo, Al, and Pd, among others. Different crystal orientations can be obtained for different wafer regions depending on circuit requirements. The openings can have various geometrical shapes depending on a desired crystal orientation. For example, a square opening will produce a 110 orientation, while a triangular opening produces a 100 crystal orientation. FIG. 3E shows the cross-sectional bottom substrate segment after photo mask removal and deposition of Ni, as an example metal, to induce recrystallization at low temperature.

Figure 3F:
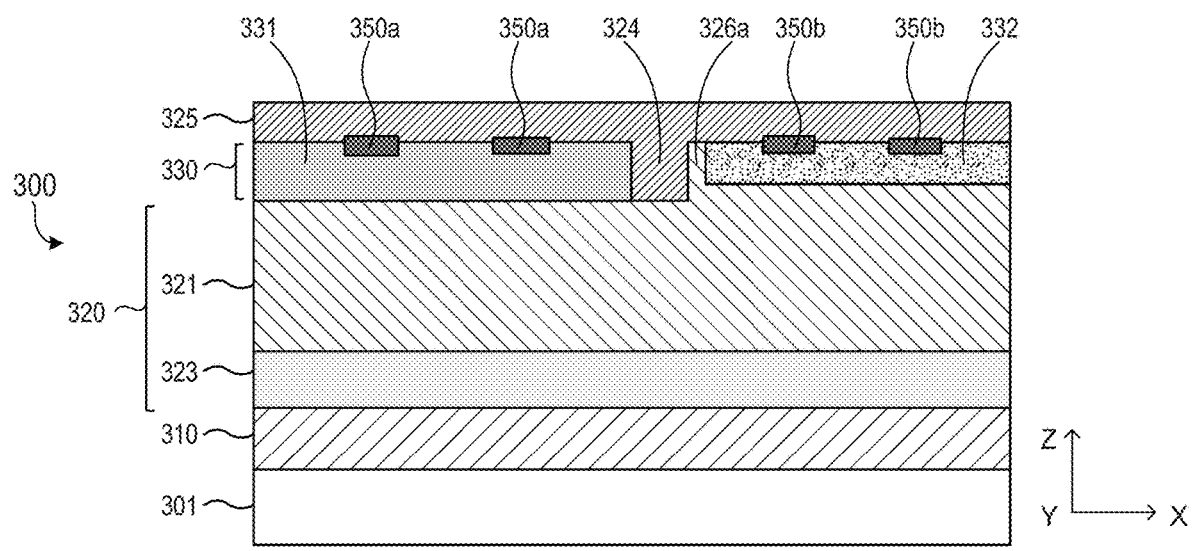

In FIG. 3F, the metal layer 350 is reacted with the semiconductor materials (e.g., 331 and 332) to form seed regions 350a (e.g., nickel silicide) and 350b (e.g., nickel germanide) for the first and second regions 331 and 332, respectively. Unreacted Ni in regions that did not contact silicon or germanium can be removed. This is followed by a dielectric deposition to fill the openings of the third dielectric layer 325.

Figure 3G:
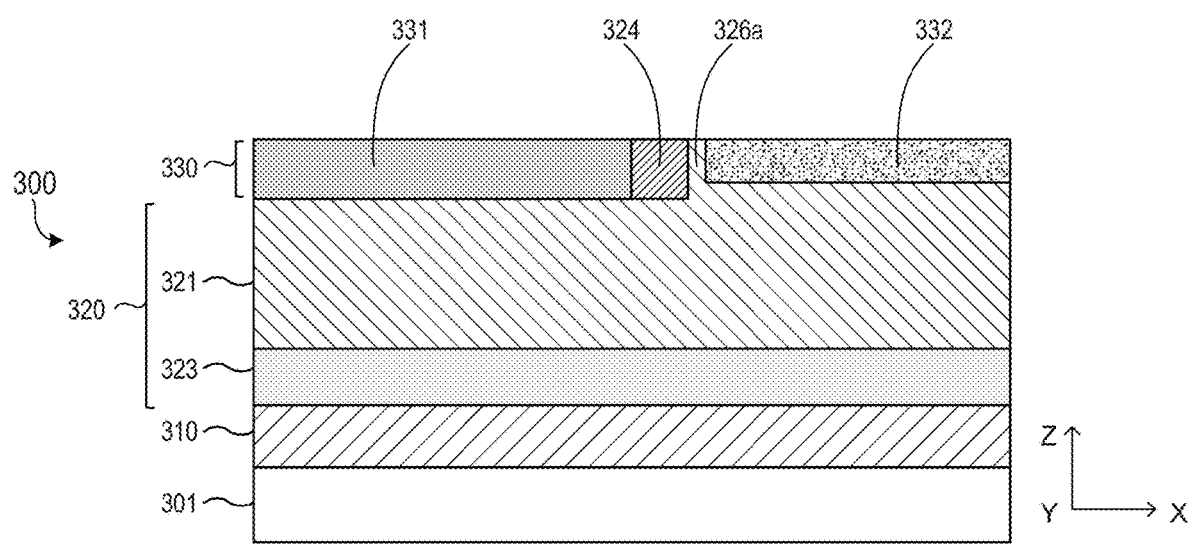

In FIG. 3G, metal crystal annealing is performed to change crystal structures of the first region 331 and the second region 332. For example, a low temperature annealing (350° C. to 600° C.) can be executed for two to six hours. This annealing makes crystalline regions in the first region 331 (e.g., silicon) and the second region 332 (e.g., germanium). After crystallization, a polishing step can be executed to remove the seed regions 350a and 350b.

Further, a second layer of semiconductor devices (not shown) can be formed over the localized regions of the target layer (e.g., 331 and 332). Accordingly, the localized regions of the target layer (e.g., 331 and 332) can function as localized substrates in some embodiments. For example, a NMOS device can be formed over crystalline silicon (e.g., the first region 331), and a PMOS device can be formed over crystalline germanium (e.g., the second region 332). Particularly, a stack of alternating materials can be grown by epitaxial growth. This can include, for example, channels for GAA devices.

FIGS. 4A-4F are cross-sectional views of a semiconductor device 400 that can eventually become the device 100B in FIG. 1B, at various intermediate steps of microfabrication, in accordance with exemplary embodiments of the disclosure. Particularly, FIGS. 4A-4F can illustrate a fabrication process that uses laser annealing of amorphous silicon adjacent to amorphous germanium to make crystalline silicon and crystalline germanium (single-crystal or large-grain polycrystalline). Note that while this embodiment shows amorphous silicon (for NMOS example) and amorphous Ge (for PMOS example) being converted to single-crystal silicon and single-crystal Ge respectively, alternatively, just one material type could be used for both channel types (i.e., Si or Ge for entire layer). In some embodiments, other semiconductor materials may be used.

Figure 4A:
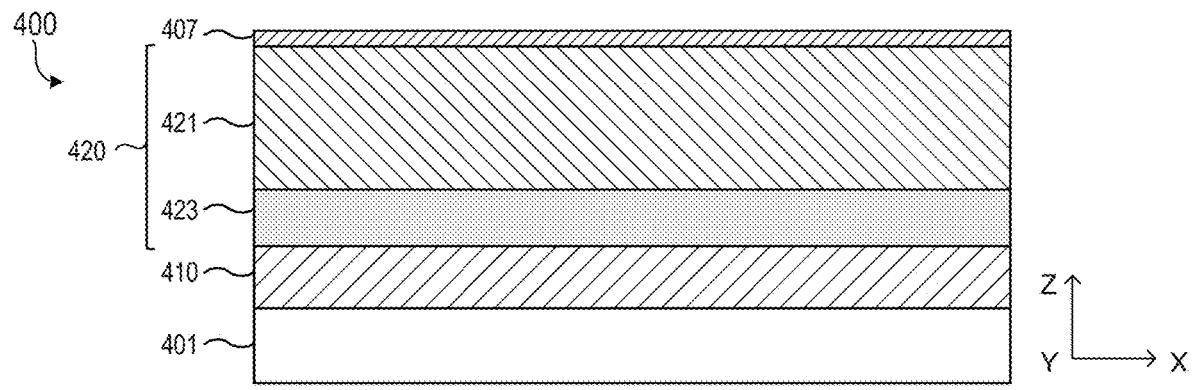
FIGS. 4A, 4B, 4C, 4D, 4E, and 4F are cross-sectional views of a semiconductor device at various intermediate steps of microfabrication, in accordance with exemplary embodiments of the disclosure.

As shown in FIG. 4A, the device 400 is similar to the device 300 in FIG. 3A. The device 400 can include a bottom substrate 401, a device plane 410, and one or more dielectric layers 420 (e.g., a first dielectric layer 421 and a second dielectric layer 423) that correspond to the bottom substrate 401, the device plane 410, and the dielectric layers 420, respectively. Further, a cap layer 407 (e.g., silicon nitride) can be formed over the first dielectric layer 421. The cap layer 407 can assist in future annealing, for example, by absorbing film stress during recrystallization.

Figure 4B:
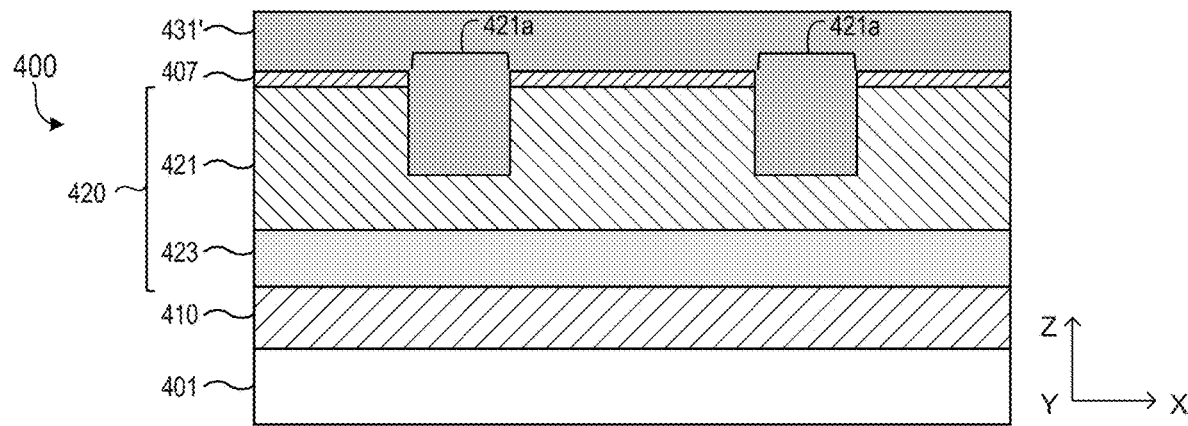

In FIG. 4B, a first semiconductor layer 431' can be formed. First, an etch mask (not shown) is formed on device areas for etching recesses 421a into the first dielectric layer 421. The recesses 421a can have various geometries and depths depending on design objectives. The first semiconductor material layer 431', such as amorphous silicon in this example, is then deposited over the device 400. This temporarily fills both recesses for future NMOS and PMOS regions.

Figure 4C:
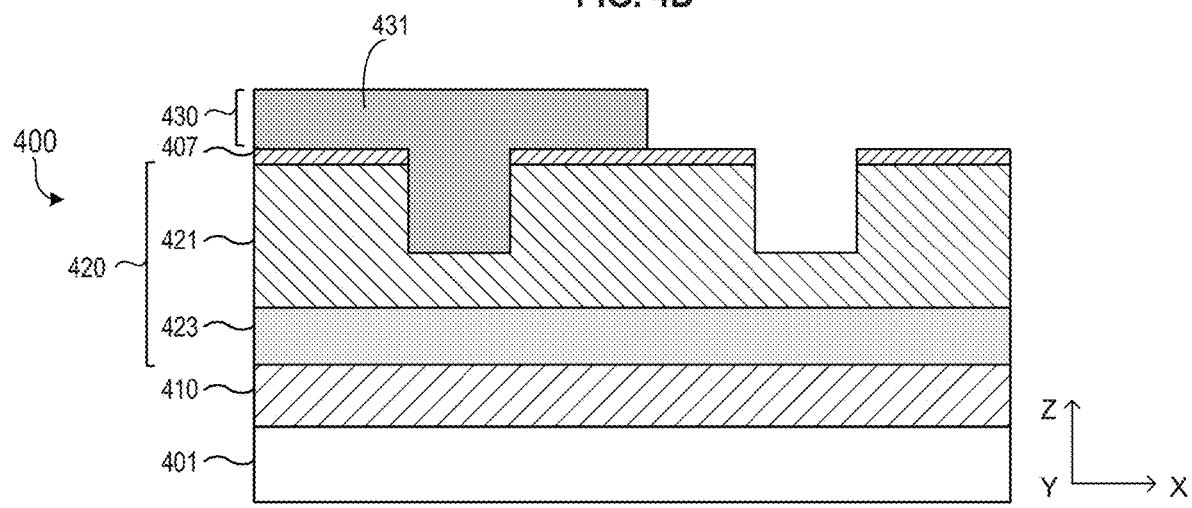

In FIG. 4C, a first localized region 431 (also referred to as a first region) of a target layer 430 is formed. In this example, future silicon regions are masked (not shown) and then uncovered amorphous silicon is removed by etching to form future PMOS regions.

Figure 4D:
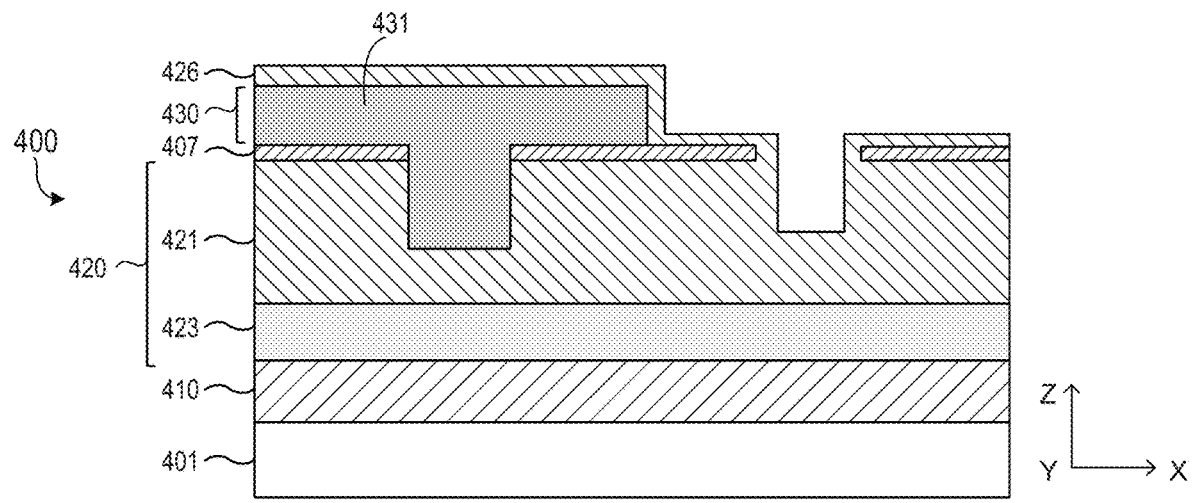

In FIG. 4D, a first dielectric film 426 is deposited conformally over the device 400 to protect the first region 431 and provide separation. In this example, the first dielectric film 426 is made of a same material as the first dielectric layer 421.

Figure 4E:
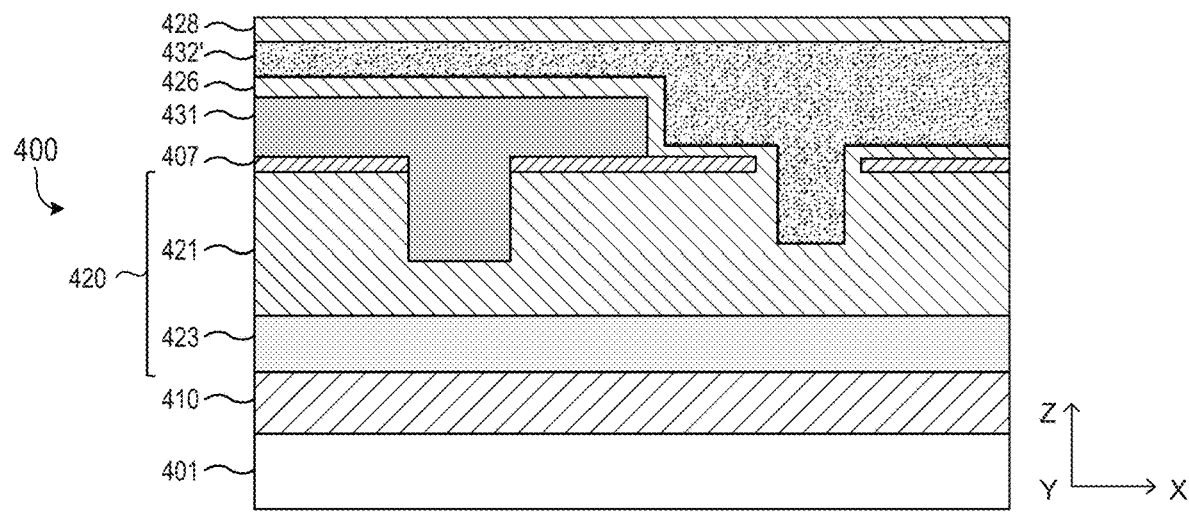

In FIG. 4E, a second semiconductor layer 432', such as amorphous germanium, is deposited over the device 400, which can fill future PMOS regions and result in an overburden of Ge. A second dielectric film 428 that includes a future second localized region can be then deposited on top of the second semiconductor layer 432'. Subsequently, a laser annealing step can be executed, for example, to anneal both the first region 431 (e.g., amorphous Si) and the second semiconductor layer 432' (e.g., amorphous Ge) to convert these to crystalline regions. Particularly, a scanning laser annealing can be used. Example wavelength ranges are 50 to 900 nm with E=1 to 15 W of power. The dielectric layers 420 can protect the device plane 410 from a temperature spike.

Figure 4F:
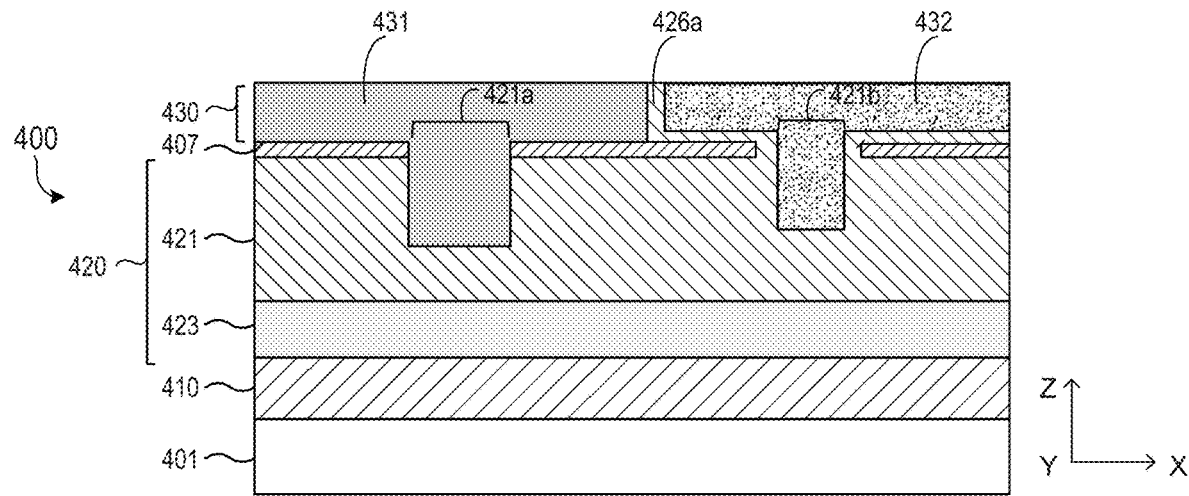

In FIG. 4F, the device 400 can then be cleaned and polished down to the first region 431 so that a second localized region 432 (also referred to as a second region) is formed. Consequently, the target layer 430 includes the first region 431 and the second region 432 that are separated from each other by a vertical portion of the first dielectric film 426a. Note that the target layer 430 can extend into the first dielectric layer 421. In this example, the first dielectric layer 421 has a first recess 421a filled by the first region 431 and a second recess 421b filled by the second region 432. Additional processing can then be continued based on chip design. For example, epitaxial planes for 3D devices can be formed over the first and second regions 431 and 432.

FIGS. 5A-5E are cross-sectional views of a semiconductor device 500 that can eventually become the device 100C in FIG. 1C, at various intermediate steps of microfabrication, in accordance with exemplary embodiments of the disclosure. Particularly, FIGS. 5A-5E can illustrate an example embodiment of germanium crystal enhancement using a Ge channel structure using re-crystallization in a localized region. Ge structures can be cylindrical or rectangular. As can be appreciated, various modifications and alternatives are contemplated. Undoped amorphous Ge is used as a primary example flow. Undoped amorphous silicon may also be used. Phosphorus or arsenic in-situ doped Ge channel can have various concentrations. Likewise, boron doped in-situ Ge channel can be used with various doping levels. Dopant selection and level can also be varied for silicon channels. Additionally, other semiconductor materials may be used.

Figure 5A:
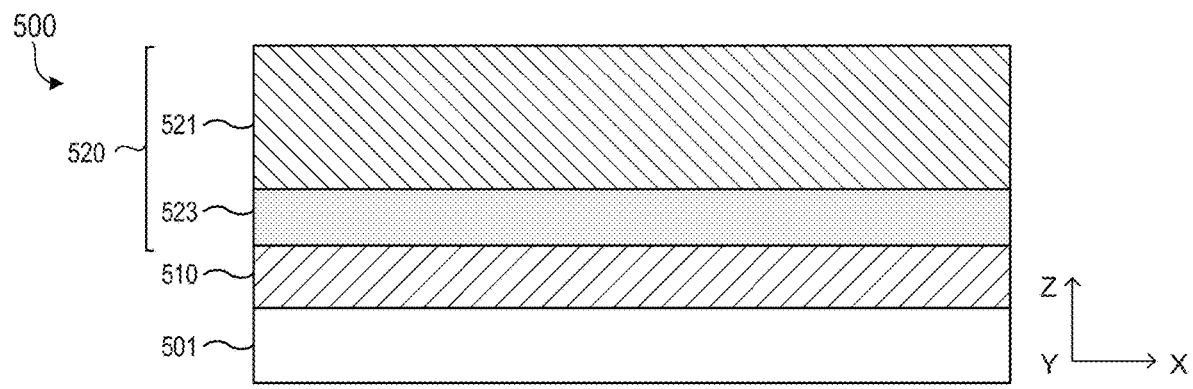
FIGS. 5A, 5B, 5C, 5D, and 5E are cross-sectional views of a semiconductor device at various intermediate steps of microfabrication, in accordance with exemplary embodiments of the disclosure.

FIG. 5A is similar to FIG. 3A and can be used as a starting point. Similarly, the device 500 can include a bottom substrate 501, a device plane 510, and one or more dielectric layers 520, such as a first dielectric layer 521 and a second dielectric layer 523. The descriptions have been provided above and will be omitted herein for simplicity purposes. Note that in some embodiments, the second dielectric layer 523 can function as the dielectric layers 520 while the first dielectric layer 521 can function as a dielectric material that will isolate future localized regions (e.g., in FIG. 1C).

Figure 5B:
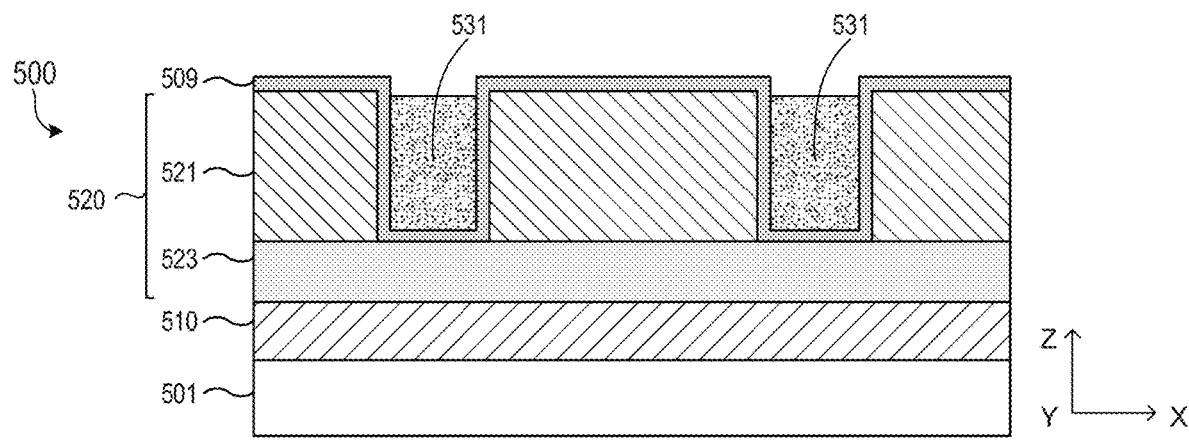

In FIG. 5B, an etch mask (not shown) first defines openings to form in the first dielectric layer 521, followed by a conformal deposition of a dielectric film 509 and deposition of a target layer (not shown) to fill defined openings. A CMP process is then performed to remove a portion of the target layer that is over the first dielectric layer 521. As a result, the remaining portion of the target layer forms localized regions 531. The target layer can be made of amorphous boron-doped germanium. The localized regions 531 can be slightly recessed by etching back.

Figure 5C:
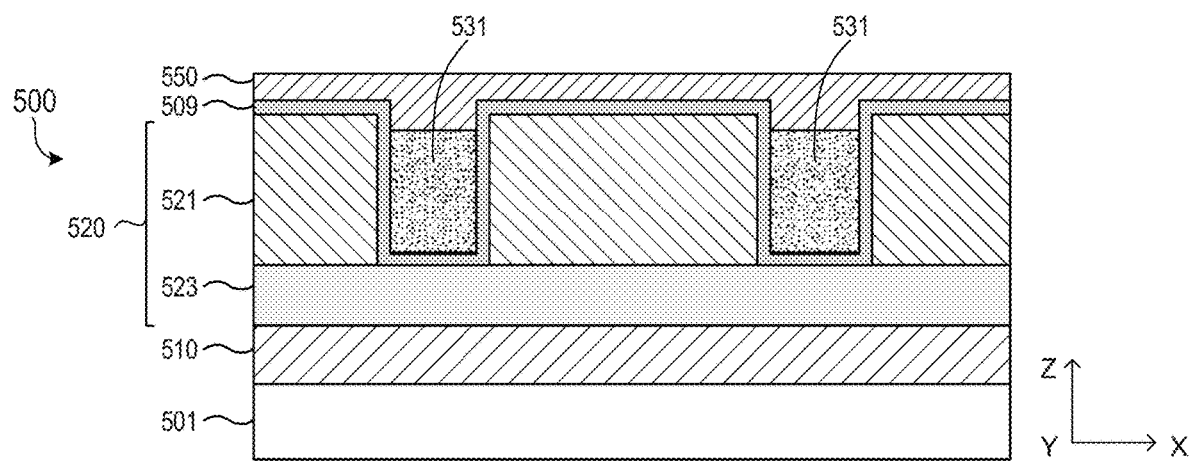
Figure 5D:
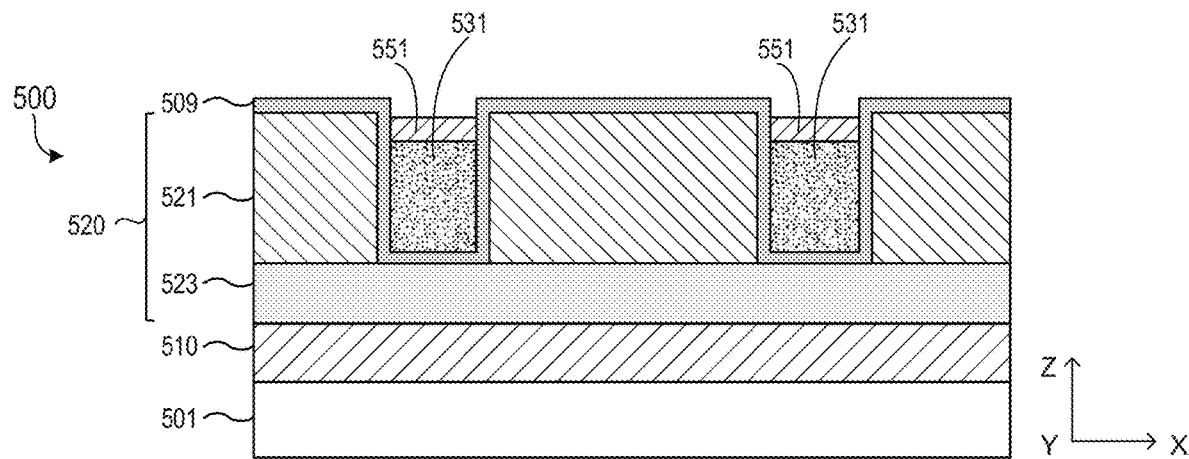

In FIG. 5C, a metal is deposited over the device 500. In this example, it is Ni deposition. In FIG. 5D, localized seed regions 551 (e.g., nickel germanide) are formed, followed by removal of unreacted Ni.

Figure 5E:
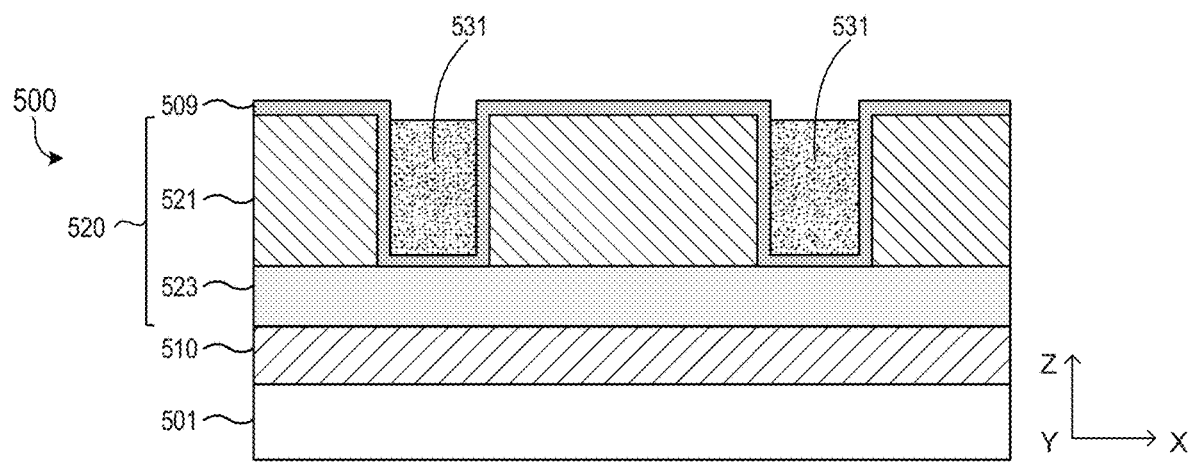

In FIG. 5E, an annealing step is executed that causes crystallization of the localized regions 531 (e.g., boron-doped germanium). Note that the crystallization can propagate from the localized seed regions 550 at the top of the structure through the entire height of the localized regions 531. After crystallization, a polishing step can be executed to remove seed regions 551. Further, additional processing can continue such as nanostack formation for NMOS and PMOS regions over the localized regions 531.

FIGS. 6A-6H are cross-sectional views of a semiconductor device 600 at various intermediate steps of microfabrication, in accordance with exemplary embodiments of the disclosure. Particularly, FIGS. 6A-6H can illustrate an embodiment of germanium crystal enhancement using a cylindrical Ge shell vertical channel structure. Ge is used as an exemplary material in this embodiment. Amorphous silicon or another semiconductor material may also be used. The cylindrical Ge shell can be used to make a high performance 3D NAND cell with in-situ doping (this acts as a vertical channel for a 3D NAND device). Phosphorus or arsenic in-situ doped Ge channel can have various concentrations. Likewise, boron doped in-situ Ge channel can be used with various doping levels. Dopant selection and level can also be varied for silicon channels.

Figure 6A:
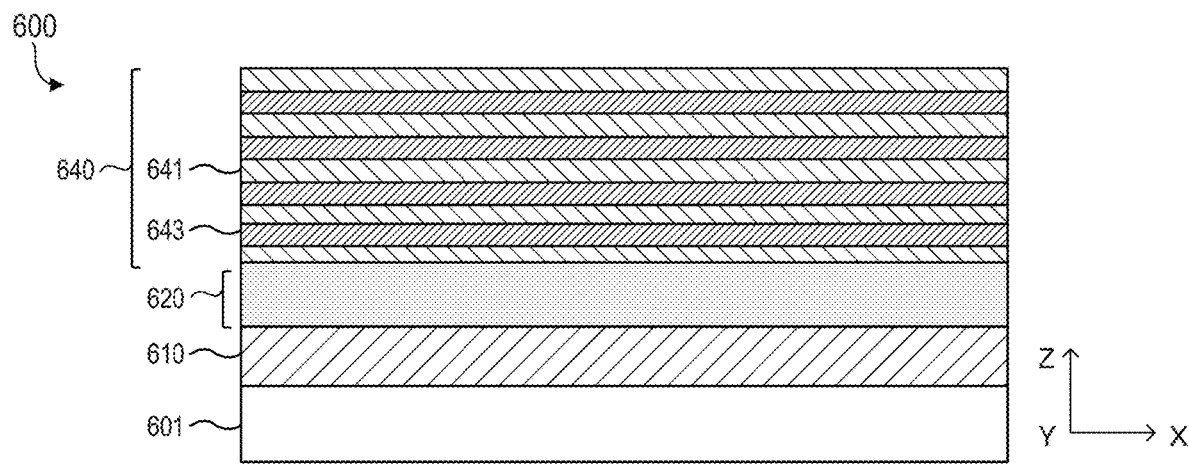
FIGS. 6A, 6B, 6C, 6D, 6E, 6F, 6G, and 6H are cross-sectional views of a semiconductor device at various intermediate steps of microfabrication, in accordance with exemplary embodiments of the disclosure.

In FIG. 6A, the device 600 can include a device plane 610 over a bottom substrate 601 and one or more dielectric layers 620 over the device plane 610. An alternating stack 640 of insulating layers 641 and sacrificial word line layers 643 is formed over the one or more dielectric layers 620. While FIG. 6A shows a few alternating layers, this alternating stack 640 can typically include more layers, for example a hundred layers or more. This can all be formed over the device plane 610. The bottom substrate 601 can be a silicon plane. The insulating layers 641 can be silicon oxide. The sacrificial word line layers 643 can be silicon nitride or polysilicon.

Figure 6B:
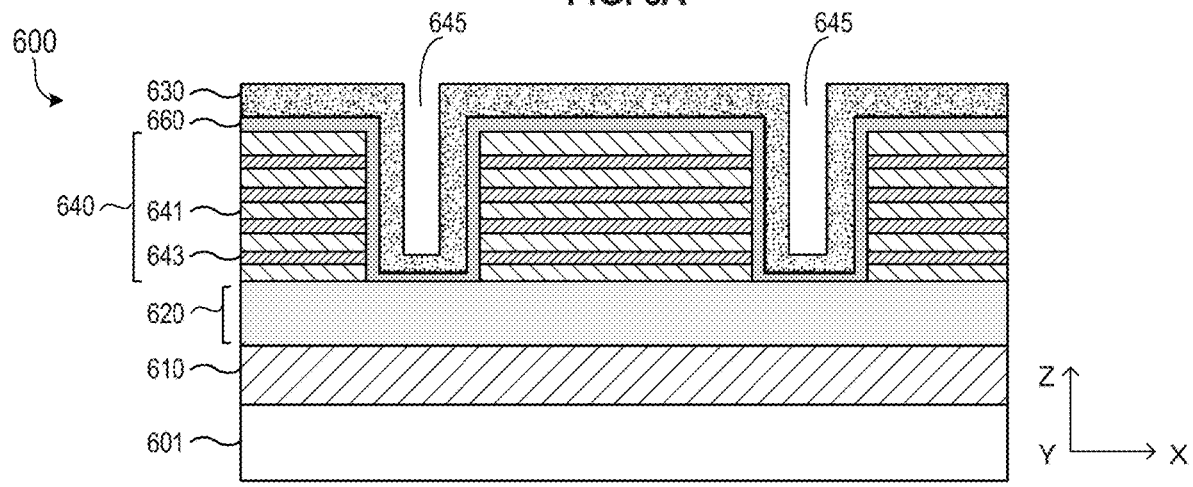

In FIG. 6B, an etch mask (not shown) is used to devise future vertical channel regions. For example, channel openings 645 (e.g., cylinders or trenches) can be etched into the alternating stack 640 of insulating layers 641 (e.g., silicon oxide) and sacrificial word line layers 643 (e.g., silicon nitride). The etch mask is then removed, and a conformal stack 660 is deposited. Next, a conformal or semi-conformal target layer 630 is deposited. In some embodiments, the conformal stack 660 can include a barrier layer (e.g., silicon oxide) over a charge trap layer (e.g., silicon nitride) over a tunneling layer (silicon oxide). In some embodiments, the target layer 630 can function as a future channel layer and include amorphous silicon, amorphous germanium, or another semiconductor material. In this example, the target layer 630 is made of amorphous germanium that can be phosphorous doped.

Figure 6C:
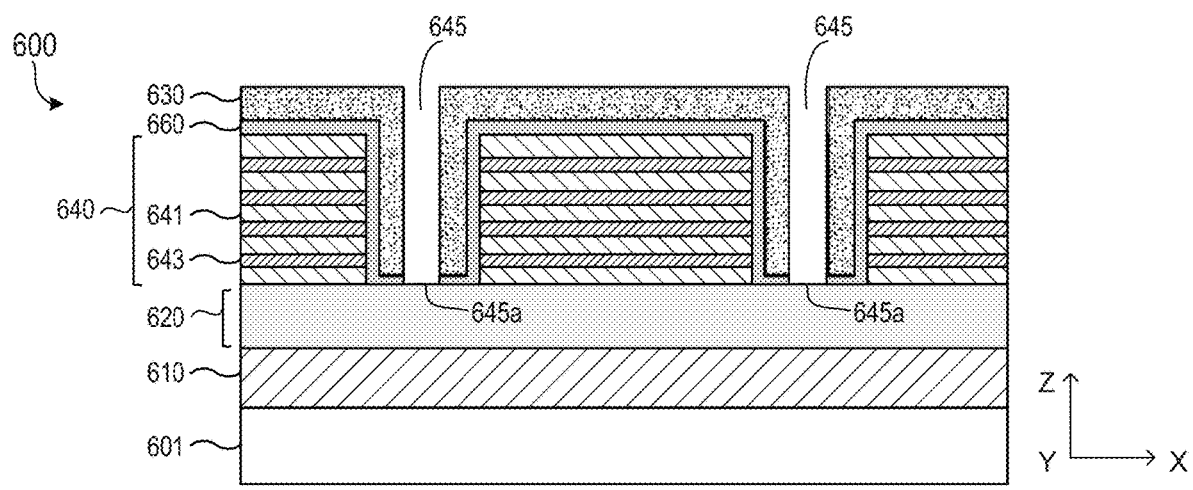

In FIG. 6C, bottom portions of the openings 645a are uncovered. This can be accomplished, for example, by a directional etch that removes the conformal stack 660 and the target layer 630 (e.g., germanium) from the bottoms of the cylindrical openings 645a.

Figure 6D:
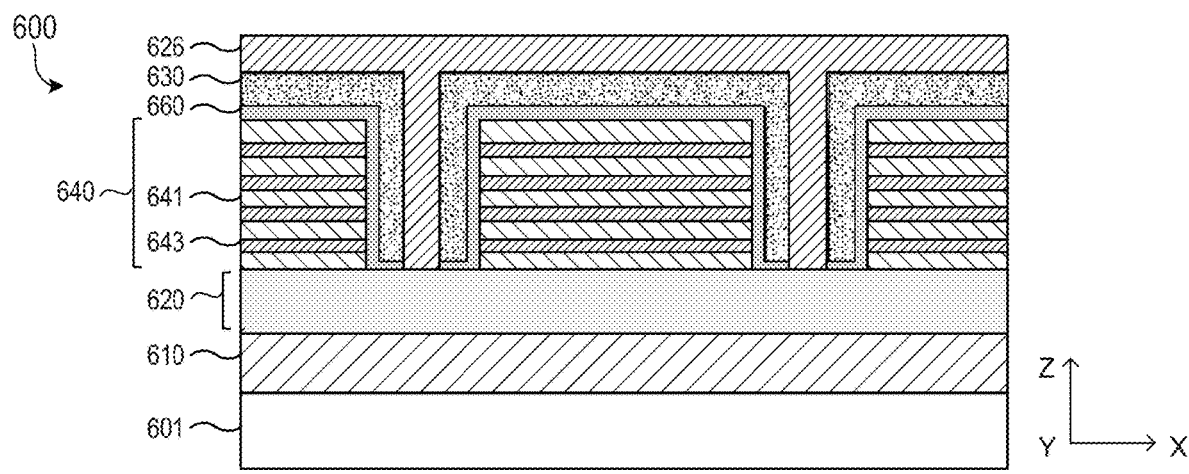
Figure 6E:
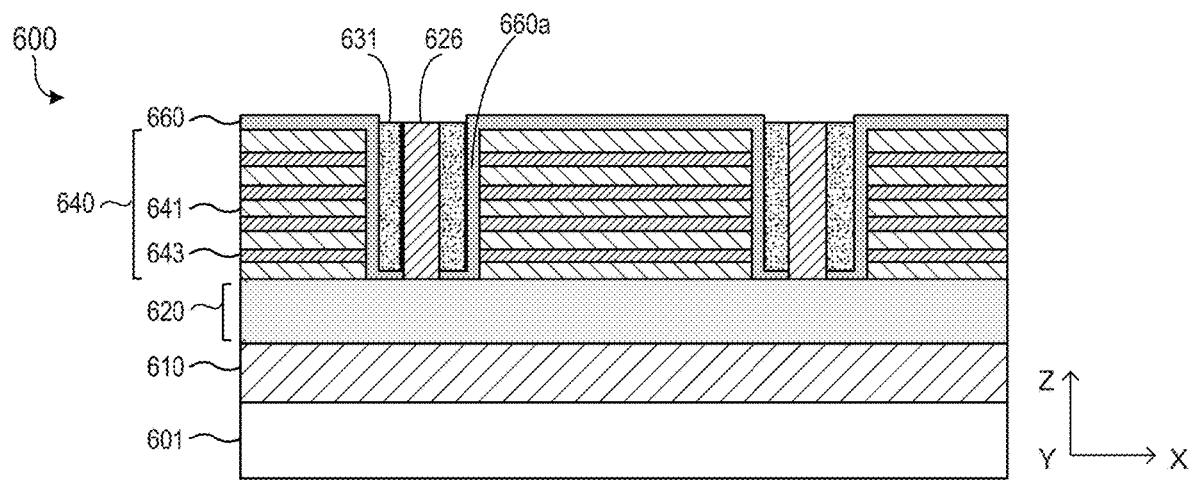
Figure 6F:
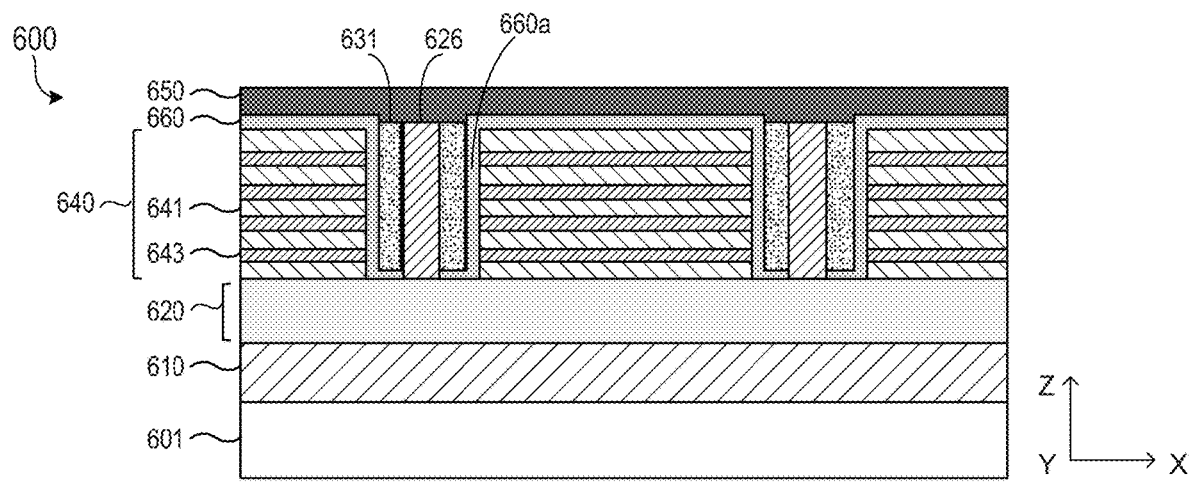

In FIG. 6D, a dielectric film 626 can be formed to fill the channel openings 645. This dielectric film 626 can be made of silicon oxide and deposited by atomic layer deposition. In addition to filling the cavity, there can be an overburden of oxide, which can be removed via CMP as illustrated in FIG. 6E. The target layer 630 can be slightly recessed. As a result, sidewall structures 660a) are formed on sidewalls of the channel openings 645, and the remaining target layer 630 can form localized regions 631. The localized regions can function as vertical channel layers. In FIG. 6F, a metal layer 650 (e.g., nickel) is deposited over the device 600, primarily to deposit the metal over the localized regions 631.

Figure 6G:
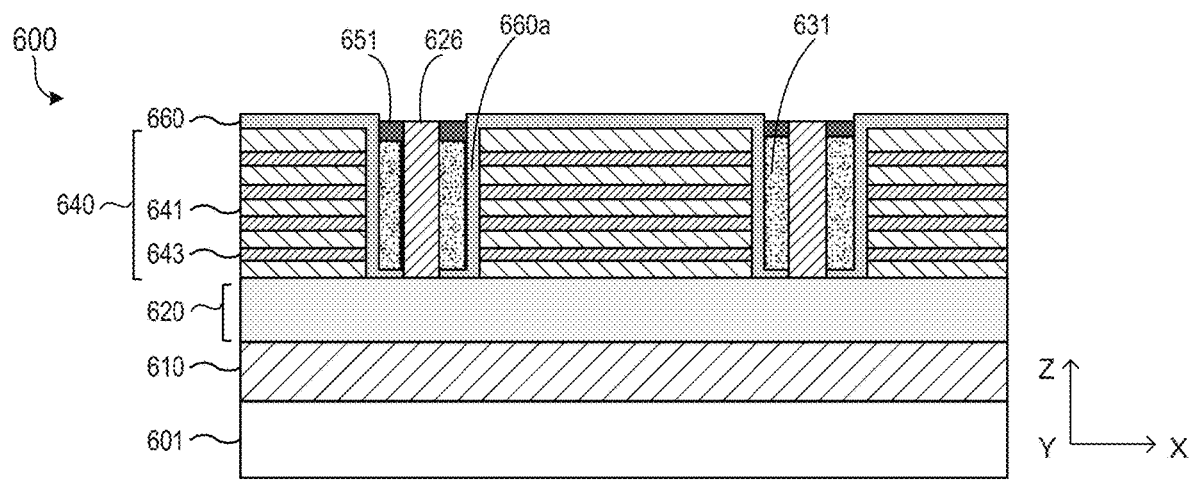

In FIG. 6G, localized seed regions 651 (e.g., nickel germanide) are then formed over the localized regions 631. Unreacted metal is removed from other surfaces. An annealing step is then executed (bake or laser) to crystallize the localized regions 631 (e.g., amorphous germanium) using the localized seed regions 651 (e.g., nickel germanide) to direct crystal orientation. Note that crystallization can propagate from top surfaces of the localized regions 631 to bottom surfaces of the localized regions 631 so that the localized regions 631 are now entirely crystalline or crystalline with larger grain boundaries.

Figure 6H:
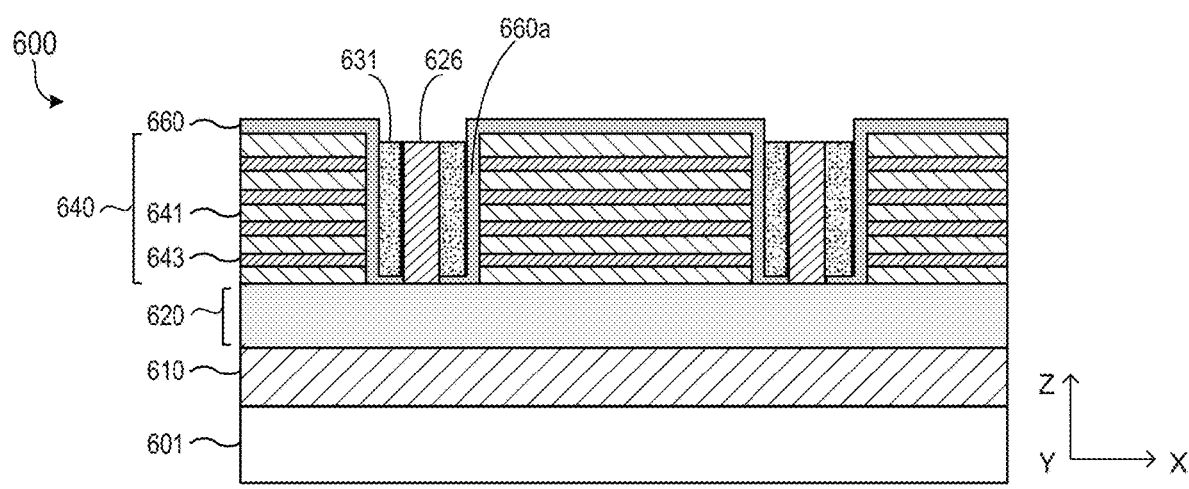

In FIG. 6H, a polishing step can be executed to remove the localized seed regions 651 after crystallization. Further, while not shown, the sacrificial word line layers 643 can be replaced with word line layers, such as tungsten or other metals to complete 3D NAND word lines with single-crystal Ge channels as part of a level of memory devices formed over the existing device plane 610. Consequently, a vertical array of memory cells is formed. Additionally, while not shown, the device 600 can also include a staircase region with contact structures that are connected to respective word line layers, dummy channel structures, gate line slit structures, an array common source, and other components that are commonly seen in 3D NAND devices.

The various embodiments described herein offer several advantages. For example, multiple levels of semiconductor structures can be stacked on a single wafer. At least one layer of semiconductor devices can be formed over the original bottom substrate, and the crystalline localized regions of the target layer (e.g., 331, 332, 431, 432, and 531) can function as localized substrates for additional layers of semiconductor devices. The localized regions (e.g., 631) can also function as vertical channel layers for 3D NAND devices. In addition, the existing semiconductor devices can be protected from temperature spikes or high temperature during the annealing process which renders the localized regions crystalline.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
    a bottom substrate;
    a device plane over the bottom substrate, the device plane including at least a first layer of semiconductor devices;
    a dielectric layer over the device plane;
    localized substrates over the dielectric layer, the localized substrates separated from each other along a top surface of the bottom substrate, wherein at least two of the localized substrates comprise different semiconductor materials; and
    a second layer of semiconductor devices over the localized substrates.

2. The semiconductor device of claim 1, wherein the dielectric layer comprises a recess filled by a corresponding localized substrate.

3. The semiconductor device of claim 1, wherein the localized substrates are crystalline.

4. The semiconductor device of claim 1, wherein the localized substrates comprise at least one of silicon or germanium.

5. The semiconductor device of claim 4, wherein the second layer of semiconductor devices comprises an n-type metal-oxide-semiconductor (NMOS) over a localized silicon substrate and a p-type metal-oxide-semiconductor (PMOS) over a localized germanium substrate.

6. A method of microfabrication, the method comprising:
    forming a device plane over a bottom substrate, the device plane including at least a first layer of semiconductor devices;
    forming a dielectric layer over the device plane;
    forming a target layer over the dielectric layer, the target layer including localized regions that are separated from each other along a top surface of the bottom substrate, wherein at least two of the localized substrates comprise different semiconductor materials, wherein the target layer extends in a direction parallel to a working surface of the bottom substrate, and the localized regions extend in the direction; and
    forming a second layer of semiconductor devices over the localized regions of the target layer.

7. The method of claim 6, further comprising forming recesses in the dielectric layer so that the target layer fills the recesses.

8. The method of claim 7, further comprising removing a portion of the target layer over the dielectric layer so that the remaining portion of the target layer is in the recesses.

9. The method of claim 6, further comprising performing a thermal process to increase crystallinity of the localized regions of the target layer.

10. The method of claim 9, wherein the thermal process comprises metal crystal annealing.

11. The method of claim 10, prior to performing the thermal process, further comprising:
    forming a patterned seed layer on the target layer, the patterned seed layer including localized seed regions on the localized regions of the target layer.

12. The method of claim 11, wherein the localized seed regions have at least one geometric shape that directs crystallization of the localized regions of the target layer to a predetermined crystal orientation during the metal crystal annealing.

13. The method of claim 9, wherein the thermal process comprises laser annealing.

14. The method of claim 13, prior to forming the target layer, further comprising:
    forming a cap layer over the bottom substrate; and
    forming recesses in the cap layer so that the target layer fills the recesses.

15. The method of claim 9, wherein:
    the thermal process makes the localized regions of the target layer crystalline; and
    the crystalline localized regions of the target layer function as localized substrates for the second layer of semiconductor devices.

16. The method of claim 9, prior to performing the thermal process, further comprising doping the localized regions of the target layer.

* * * * *

UNITED STATES PATENT AND TRADEMARK OFFICE
CERTIFICATE OF CORRECTION

Page 1 of 1

PATENT NO. : 11,521,972 B2
APPLICATION NO. : 17/097146
DATED : December 6, 2022
INVENTOR(S) : Gardner et al.

It is certified that error appears in the above-identified patent and that said Letters Patent is hereby corrected as shown below:

On the Title Page

Column 2, Item (56), under "OTHER PUBLICATIONS", Line 1, delete "PCT/U82023/025082," and insert -- PCT/US2021/025082, --, therefor.

In the Specification

In Column 7, Line 35, delete "oxynidride" and insert -- oxynitride --, therefor.

Signed and Sealed this
Seventeenth Day of October, 2023

Katherine Kelly Vidal
*Director of the United States Patent and Trademark Office*